United States Patent [19]

Cutler et al.

[11] 4,364,007
[45] Dec. 14, 1982

[54] UNINTENTIONAL IMPEDANCE DETECTION SYSTEM

[75] Inventors: John H. Cutler; Willard B. Jarvinen, both of Roanoke; Loren H. Walker, Salem, all of Va.

[73] Assignee: General Electric Company, Salem, Va.

[21] Appl. No.: 142,782

[22] Filed: Apr. 22, 1980

[51] Int. Cl.³ .................................................. G01R 31/02
[52] U.S. Cl. ........................................ 324/51; 340/651; 361/42; 361/86
[58] Field of Search .................... 324/51, 54; 340/650, 340/651; 361/42, 44, 47–50, 78, 80, 86

[56] References Cited

U.S. PATENT DOCUMENTS

| | | | |
|---|---|---|---|
| 2,700,125 | 1/1955 | King et al. | 340/650 |
| 2,999,231 | 9/1961 | Kusters et al. | 340/651 |
| 3,441,801 | 4/1969 | Kraus | 361/49 |
| 3,492,567 | 1/1970 | Rissolo | 340/650 X |
| 3,496,414 | 2/1970 | Logston | 340/650 X |
| 3,757,169 | 9/1973 | Beresnikow | 340/650 X |
| 3,857,070 | 12/1974 | Smith | 340/650 X |
| 3,886,409 | 5/1975 | Scarpino | 324/51 X |
| 4,053,876 | 10/1977 | Taylor | 324/51 X |

FOREIGN PATENT DOCUMENTS

| | | | |
|---|---|---|---|
| 696801 | 8/1940 | Fed. Rep. of Germany | 361/42 |
| 55-80066 | 6/1980 | Japan | 324/51 |
| 1030243 | 5/1966 | United Kingdom | 324/51 |
| 1052402 | 12/1966 | United Kingdom | 324/51 |
| 246642 | 11/1969 | U.S.S.R. | 361/42 |
| 275206 | 10/1970 | U.S.S.R. | 361/47 |

*Primary Examiner*—Gerard R. Strecker
*Attorney, Agent, or Firm*—Arnold E. Renner

[57] ABSTRACT

A detection system for detecting unintentional impedances between the power conductors and a first node of either a power conversion circuit or a load, the first node typically being an earth ground. The circuit has power level lines utilizing a wye-connected line filter network which has equal impedance values for each leg of the line filter and which defines a first node at the common connection thereof. A different impedance network is also connected in wye-fashion to the power level lines and defines a second node at the common connection thereof. Each impedance leg of the impedance network is also equal in impedance value whereby the second node normally has the same potential as the first node. The potential difference between the first and second nodes is frequency compensated to produce a system output signal indicative of a predetermined value of current in unintentional impedance between any of the power conductors and the first node.

20 Claims, 5 Drawing Figures

UNINTENTIONAL IMPEDANCE DETECTION SYSTEM

FIELD OF THE INVENTION

The present invention relates generally to a detection system for detecting a predetermined value of any "unintentional" impedance between a first node and the power conductors of a power conversion circuit and its load, the first node typically being an earth ground. An "unintentional" impedance herein connotes an impedance with a significantly low value of impedance between two points whereby significant levels of unintentional current can flow through such impedance. More particularly, the present invention relates to a detection system for use in a "frequency-changing" power conversion circuit which includes a static power converter and power level lines for connecting to an alternating current power source, the connotation of the term "frequency-changing" including herein the changing of an alternating current voltage to a direct current voltage.

DESCRIPTION OF THE PRIOR ART

One known unintentional impedance detection system involves the detection of "unreturned" current from the combination of all power lines and a neutral line, if there is one, which supply a load. By monitoring the magnetic flux in a toroidal core surrounding the combination of lines, the sum of the currents flowing through the toroidal core can be determined. In the absence of an unintentional impedance between a power line and a first node the sum of the currents will be zero. Upon the occurrence of an unintentional impedance between a power line and the first node, the sum of the currents assumes a non-zero value, thereby indicating the occurrence of "unreturned" current from the load. A system output signal indicative of a predetermined value of such an unintentional impedance is normally provided when the "unreturned" current exceeds a preselected value.

A shortcoming of the described detection system is the dependence upon the use of a current transformer. Such a transformer is a large and expensive device. Further, with certain frequency-changing configurations, the frequency of the "unreturned" current may be quite low compared with the power supply frequency. Hence, the current transformer may need to be specially designed to faithfully transform the low frequency currents, including direct current.

Another known unintentional impedance detection system, as illustrated, for example, in U.S. Pat. No. 3,857,070, is used in a power conversion circuit which has a positive and a negative direct current power line. In this system, a "grounding" impedance is connected between a first node, which normally is at a ground potential, and the common node of a pair of series-connected impedances which is connected across the positive and the negative direct current power lines. In the absence of an unintentional impedance between the power conductors of the power conversion circuit and the first node, the current in the grounding impedance is zero. A system output signal indicating a predetermined value of the unintentional impedance is provided with the current in the grounding impedance exceeds a preselected value, or, equivalently, when the voltage across the grounding impedance exceeds a preselected value.

The latter detection system does not suffer from frequency-dependent sensitivity to unintentional impedance if the grounding impedance is purely resistive and the means for sensing the voltage across the grounding impedance has uniform response over the range of power frequencies utilized. But, if the grounding impedance is other than purely resistive, the latter detection system may suffer from frequency-dependent sensitivity. A separate shortcoming of the latter detection system exists where resistive grounding impedances are used inasmuch as the resulting power losses require the use of "power" level impedance elements, that is to say, elements rated above one watt of power dissipation, as opposed to "signal" level impedance elements rated at a lower value, thereby increasing the complexity and cost of a unintentional impedance detection system.

OBJECTS OF THE INVENTION

It is accordingly an object of the present invention to provide a novel detection system for detecting unintentional impedances between a first node and the power conductors of a power conversion circuit and its load, wherein the magnitude of such an unintentional impedance which is low enough to cause the generation of a system output signal is highly predictable.

Another object of this invention is to provide a detection system for detecting unintentional impedances between a first node and the power conductors of a power conversion circuit and its load, which incorporates a static power converter of the type having a positive and a negative direct current line and which system is capable of detecting an unintentional impedance between either the positive or the negative direct current line and the first node.

Another object of this invention is to provide a detection system for detecting unintentional impedances between a first node and the power conductors of a frequency-changing power conversion circuit and its load, having a substantially constant sensitivity to unintentional impedances between points energized by voltages of different frequencies including direct current and the first node.

Another object of this invention is to provide a detection system for detecting unintentional impedances between a first node and the power conductors of a frequency-changing power conversion circuit and its load, which utilizes a ripple voltage for detection of an unintentional impedance between any point in circuit with the load, including any neutral of the load, and the first node.

Another object of this invention is to provide a detection system for detecting unintentional impedances between a first node and the power conductors of a power conversion circuit and its load, which utilizes pre-existing power level impedances of the power conversion circuit and thereby avoids the necessity of utilizing additional power level impedances.

SUMMARY OF THE INVENTION

In accordance with the present invention, a detection system is provided for detecting a predetermined value of an unintentional impedance between one of the power conductors and a first node of a network including a power conversion circuit, a static power converter included in the power conversion circuit, a load supplied by the power conversion circuit, and a plurality of power level lines for connecting to a single-phase or a polyphase power source. In the preferred form of the present invention, illustrated as applied to a three-phase source, a first plurality of impedances constitutes a line filter and is connected in wye fashion to the power level lines. Each impedance leg of the wye is substantially equal in impedance value. The common connection of the first plurality of impedances defines a first node. A second plurality of impedances is also connected in wye fashion to the power level lines, and the common node thereof defines a second node. Each impedance leg of the latter wye also is substantially equal in impedance value, whereby the second plurality of impedances is effective for establishing a potential at the second node which is substantially equivalent to the potential at the first node in the absence of an unintentional impedance between one of the power conductors and the first node.

A frequency selective network is included in a sensing means and, in response to the potential difference between the first and second nodes, produces an output proportional to the magnitude of current in an unintentional impedance between one of the power conductors and the first node, independent of the frequency and voltage energizing such unintentional impedance. The sensing means may include a full-wave rectifier to produce a rectified output voltage in response to the output of the frequency selective means, and a comparator, which compares the rectified output voltage with a reference voltage representing a preselected current value in an unintentional impedance between one of the power conductors and the first node. The comparator generates a system output signal when the rectified output voltage exceeds the reference voltage.

In accordance with one aspect of the present invention wherein positive and negative direct current lines are included in the static power converter, the detection system utilizes a ripple voltage normally appearing on the positive and negative direct current lines to produce a detectable potential different between the first and second nodes which potential difference has the fundamental frequency of the ripple voltage when the ripple voltage energizes the unintentional impedance.

In accordance with another aspect of the present invention, the detection system includes a non-capacitive impedance connected between the positive direct current line of the static power converter and the first node and a non-capacitive impedance connected between the negative direct current line of the static power converter and the first node, whereby unintentional impedances between either the positive or the negative direct current line and the first node are detectable.

BRIEF DESCRIPTION OF THE DRAWING

The invention is hereinafter described with reference to the accompanying drawing in which.

DETAILED DESCRIPTION

Figure 1:
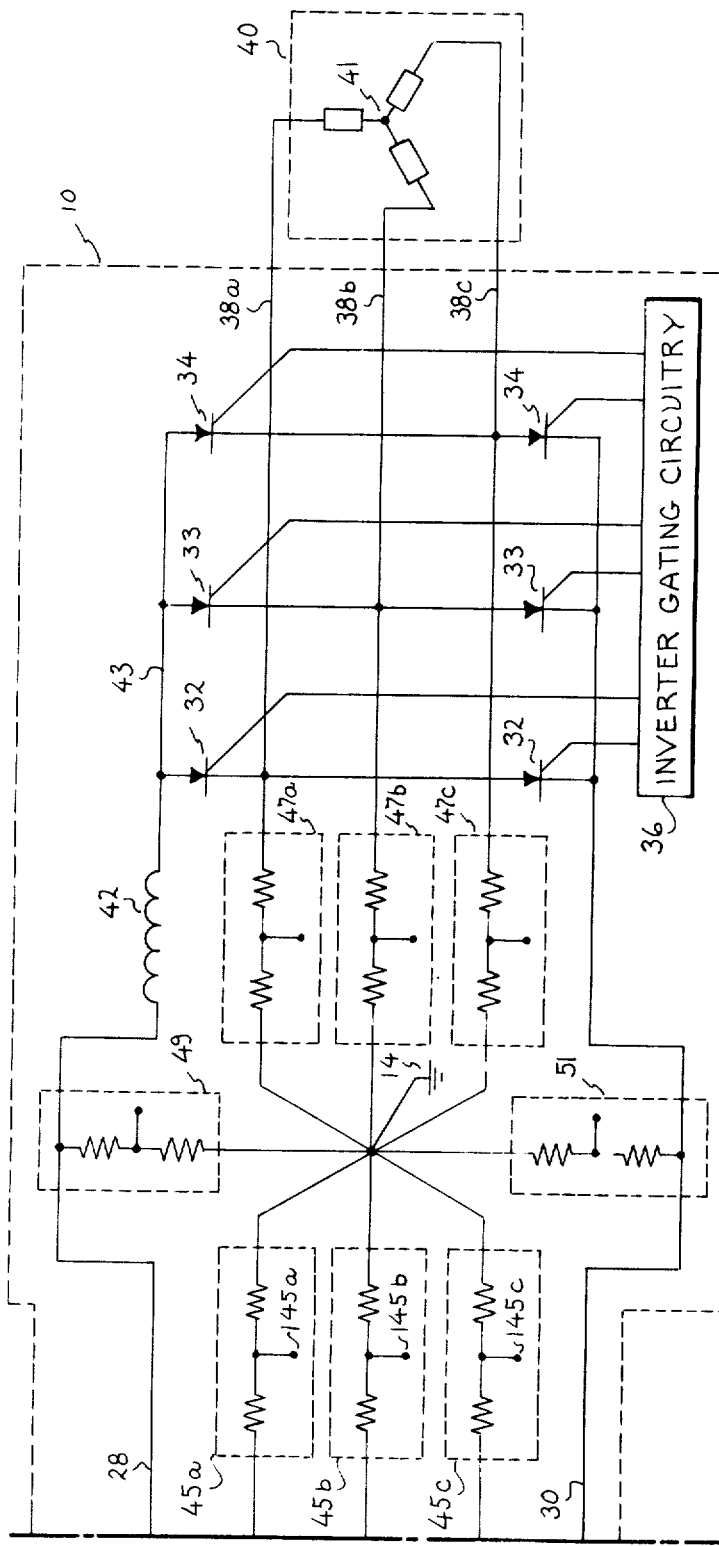
FIGS. 1A and 1B, taken together as shown in FIG. 1, is a circuit diagram partially in block diagram showing the elements of the present invention in relation to a power conversion circuit having a static power converter and showing a power source and a load.
Figure 1A:
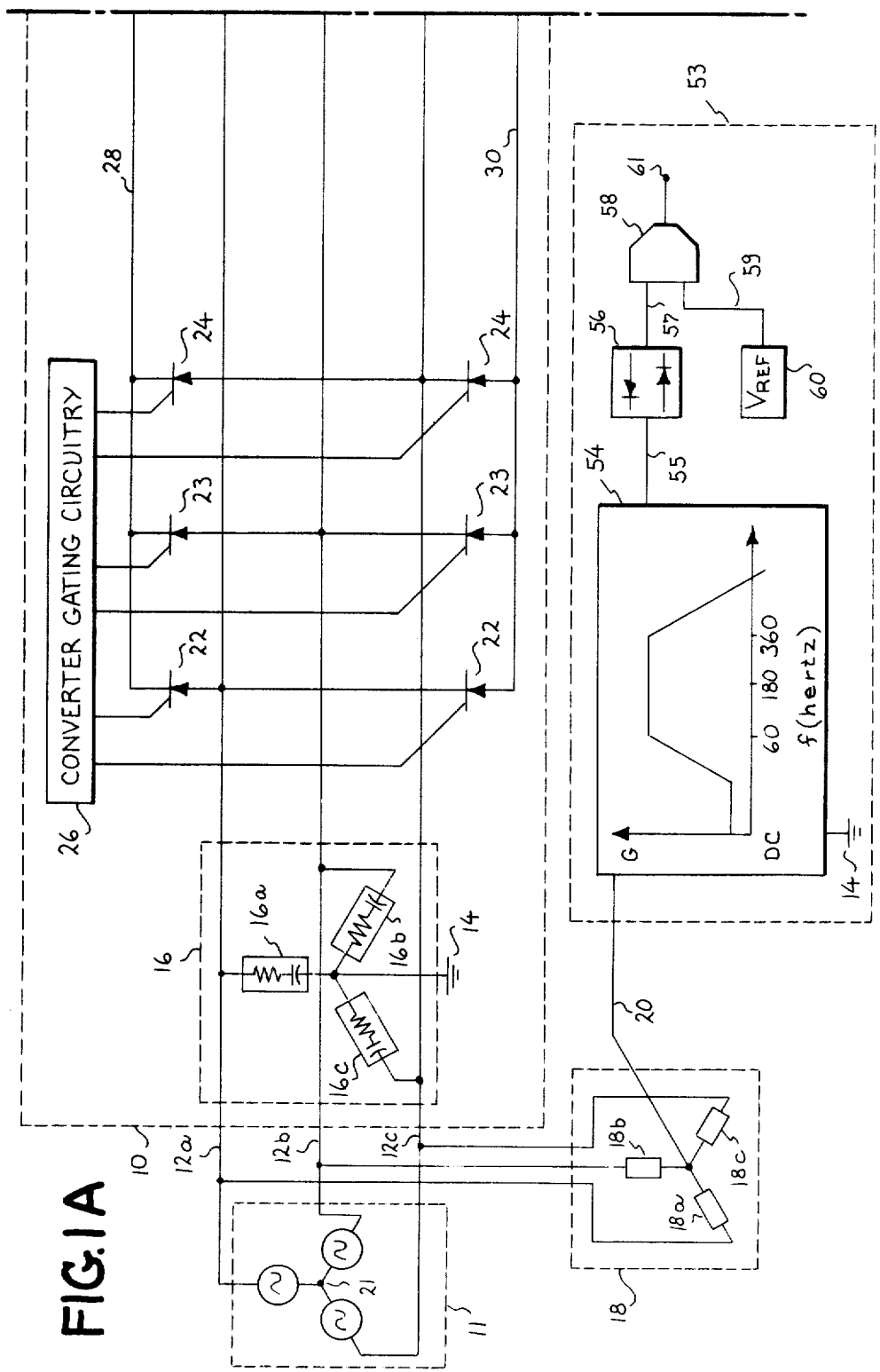

In the following description of the present invention, like reference numerals refer to like parts.

As shown in FIG. 1, a power conversion circuit generally designated 10 is supplied by three power level lines 12a through 12c. The power level lines 12a through 12c each has thereon a power level voltage of a respective different phase of a three-phase power source generally designated 11. The power source 11 is described herein as providing voltages between phase lines of 460 volts amplitude and of 60 hertz frequency, although the detection system is not limited to this voltage or frequency.

A first node 14 is shown in FIG. 1 as being a ground for the network depicted therein. This ground may or may not be an earth ground. The detection system is effective for detecting a predetermined value of any unintentional impedance between one of the power conductors of the source 11, the power conversion circuit 10, or load 40 and the first node 14. (Hereinafter in the Detailed Description, such an unintentional impedance between the specified points is simply referred to as an "unintentional impedance".)

As also shown in FIG. 1, a first plurality of impedances generally designated 16 comprises impedances 16a through 16c, each of which has a first and a second terminal. The first terminals of each of the impedances 16a through 16c are connected to the first node 14. The second terminals of each of the impedances 16a through 16c are respectively connected to the different power level lines 12a through 12c.

Each of the impedances 16a through 16c has a substantially equivalent impedance value. As a result, the first plurality of impedances 16 constitutes a balanced impedance network in the absence of any unintentional impedances, whereby the currents in each of the impedances 16a through 16c balance each other and, thus, do not provide a net current which can flow into the first node 14.

Each of the impedances 16a through 16c is shown as comprising a resistor serially connected to a capacitor. In order that the detection system may operate as predictably as possible, the magnitude of impedance at the frequency of the power source of each capacitor is small relative to the magnitude of impedance at the same frequency of any unintentional capacitance between the power level line connected to the second terminal of the corresponding one of the impedances 16a through 16c and the first node 14.

The first plurality of impedances 16 typically pre-exists in the power conversion circuit 10 as a line filter network for suppressing transient voltages which may exist on one or more of the power level lines 12a through 12c, especially where the power source 11 constitutes the secondary of a transformer. It is herein assumed that the first plurality of impedances 16 so constitutes a line filter network. Hence, for the network described herein, a typical range of magnitudes of impedance for each capacitor of impedances 16a through 16c is from 100 to 1000 ohms at 60 hertz. Also, a typical magnitude of impedance for each resistor of impedances 16a through 16c is one order of magnitude smaller than the magnitude of impedance for the corresponding capacitor of impedances 16a through 16c. Accordingly, the resulting magnitude of impedance of each of the impedances 16a through 16c is determined primarily by the magnitude of impedance of the capacitor thereof; in other words, the typical magnitude of impedance of each of the impedances 16a through 16c is approximately in the range from 100 to 1000 ohms at 60 hertz.

The magnitudes of impedance of impedances 16a through 16c at the frequency of the power source 11 are small relative to all other impedances at the same frequency respectively connected between the power level lines 12a through 12c and the first node 14. Thus, the first plurality of impedances effectively establishes the intentional impedances, respectively, between the power level lines 12a through 12c and the first node 14.

When an unintentional impedance exists which is energized by a voltage having a frequency near to or greater than the frequency of the power source 11, it appears in electrical parallel with one or more of the intentional impedances, or, effectively, one or more of impedances 16a through 16c. This unbalances the network comprising impedances 16a through 16c, whereby the currents in impedances 16a through 16c provide a net current which flows into the first node 14 and through the unintentional impedance. Due to the electrical relationship between an unintentional impedance and the intentional impedances, the magnitude of an unintentional impedance between one of the power level lines 12a through 12c and the first node 14 which can be predictably detected by the detection system is dependent upon the magnitudes of the intentional impedances. Inasmuch as the magnitudes of the intentional impedances are effectively determined by the magnitudes of impedances 16a through 16c, the magnitude of such an unintentional impedance is, accordingly, approximately in the range from 0 to 10,000 ohms.

As also shown in FIG. 1, a second plurality of impedances generally designated 18 comprises wye-connected impedances 18a through 18c, each of which has a first and a second terminal. The first terminals of the impedances 18a through 18c are interconnected and define a second node 20. The second terminals of the impedances 18a through 18c are respectively connected to the different power level lines 12a through 12c.

The impedances 18a through 18c each has a substantially equivalent impedance value and, thus, collectively constitute a balanced impedance network. As a result, the potential at the second node 20 is rendered substantially equivalent to that at the first node 14 during the absence of any unintentional impedance.

As also shown in FIG. 1, the power level lines 12a through 12c are connected to a static, or solidstate, power converter comprising thyristor pairs 22, 23 and 24. These thyristor pairs are cooperatively associated with converter gating circuitry 26 and together with circuitry 26 constitute a thyristor converter bridge. Circuitry 26, which has respective connections to the gates of the thyristors in the converter bridge, controls the gating angle of each thyristor in the converter bridge. The converter bridge effectively converts the alternating current voltages on the power level lines 12a through 12c to a direct current voltage which appears between a positive direct current line 28 and a negative direct current line 30.

The direct current lines 28 and 30 drive a thyristor inverter bridge comprising thyristor pairs 32, 33 and 34 and inverter gating circuitry 36, cooperatively associated with thyristor pairs 32, 33 and 34. The gates of each thyristor in the inverter bridge have respective connections to the gating circuitry 36, which controls the gating angle of each thyristor in the inverter bridge. The inverter bridge is connected to load lines 38a, 38b and 38c, each of which has thereon a variable frequency, alternating current voltage of a different phase and each of which is connected to a load, generally designated 40. The present invention can be practiced without a thyristor inverter bridge inasmuch as a direct current load can be supplied with power from the direct current lines 28 and 30.

The static power converter may contain, in addition to the thyristors shown, additional diodes, capacitors, and other components to make a force commutated inverter. Further, static power converters other than the general type described herein may be used with the detection system. For example, a cyclo-converter, which produces output voltages of one alternating current frequency from input voltages of another alternating current frequency without an intermediate step of producing a direct current voltage, may be used.

The thyristor converter bridge shown in FIG. 1 produces between the direct current lines 28 and 30 a ripple voltage having as the fundamental frequency thereof a harmonic of the frequency of the power source 11. Most types of alternating current to direct current converters likewise produce a ripple voltage between their direct current lines. For the circuit described herein, the ripple voltage has a fundamental frequency of 360 hertz, or the sixth harmonic of 60 hertz when the power source 11 operates at 60 hertz. The ripple voltage is present at all points on all power conductors in the network to the right of the lines 28 and 30 in FIG. 1. The ripple voltage has an amplitude which varies as a function of the direct current voltage level between the lines 28 and 30. The amplitude of the ripple voltage is at its maximum value when the direct current voltage between the lines 28 and 30 is zero. When the direct current voltage between lines 28 and 30 is near zero, and, thus, the voltages on the load lines 38a through 38c supplying the load 40 are also near zero, the energization of an unintentional impedance by the ripple voltage is most predictably detectable by the detection system.

The positive direct current line 28 shown in FIG. 1 is serially connected through an inductor 42 to another positive direct current line 43. Inasmuch as the inductor 42 appears as a very large impedance at the frequency of the ripple voltage, the direct current line 43 is effectively isolated from the direct current line 28 for voltages at the frequency of the ripple voltage. As a result of not placing a similar inductor in the negative line 30, the ripple voltage on the direct current line 30 is not balanced by the ripple voltage on the direct current line 28. This unbalanced ripple voltage is imposed on all points on all power conductors in the network to the right of the lines 30 and 43 in FIG. 1, including the neutral 41 of the load 40.

The unbalanced ripple voltage has a larger amplitude and half the frequency (or 180 hertz for the network described herein) of the ripple voltage between the lines 28 and 30, and its amplitude is uniform throughout the network to the right of the lines 30 and 43 in FIG. 1. The detection system, accordingly, more predictably detects an unintentional impedance energized by the unbalanced ripple voltage than one energized by a ripple voltage which is balanced by having components from both the positive direct current line 28 and the negative direct current line 30. Thus, an unintentional impedance between the neutral 41 of the load 40 and the first node 14 might not be predictably detectable by the detection system where the inductor 42 was not present and a balanced ripple voltage energized such unintentional impedance. In contrast, the presence of the inductor 42 causes an unbalanced ripple voltage to appear on the neutral 41 of the load 40, and thus an unintentional impedance energized thereby is predictably detectable. The inductor 42 typically pre-exists in a static power converter and constitutes a filter for filtering the direct current voltage between the lines 28 and 30 and for providing a filtered current between the lines 30 and 43. Although the inductor 42 is shown in FIG. 1 as connected to the positive direct current line 28, an unbalanced ripple voltage used by the detection system can be produced if the inductor 42 is alternately connected to the negative direct current line 30.

Static power converters of the type described herein can include voltage-sensing divider strings 45a through 45c for sampling "signal" level voltages which are proportional to the power level voltages on the power level lines 12a through 12c, respectively. The term "signal" level voltages as used herein connotes voltages of generally 10 volts or below with which signal level impedances, as defined above, may be used. Each of the strings 45a through 45c has a terminal connected to the first node 14. The other terminals of the strings 45a through 45c are respectively connected to the power level lines 12a through 12c. The strings 45a through 45c are each shown in FIG. 1 as having a voltage sampling node 145a, 145b or 145c, respectively, intermediate a pair of impedances. In each pair of impedances, the relative magnitude of one impedance with respect to the other is selected to cause the voltage on the respective node 145a, 145b or 145c, to be a signal level voltage, as defined above. Thus, a signal level voltage which is proportional to the respective voltage on one of the power level lines 12a through 12c can be monitored at each of the voltage sampling nodes 145a through 145c. The magnitude of impedance of each of the strings 45a through 45c is typically one megohm or higher.

A static power converter of the type described herein can also include voltage-sensing divider strings 47a, 47b and 47c for sampling voltages on the load lines 38a through 38c. The strings 47a through 47c are symmetrically connected in the power conversion circuit 10 with respect to the strings 45a through 45c. The magnitude of impedance of each of the strings 47a through 47c is also typically one megohm or higher.

For sampling the direct current voltages on the direct current lines 28 and 30, a static power converter of the type described herein can also include voltage-sensing divider strings 49 and 51. The string 49 is connected between the line 28 and the first node 14. Similarly, the string 51 is connected between the line 30 and the first node 14. The magnitude of impedance of each of the strings 49 and 51 is typically one megohm or higher.

The impedance strings 45, 47, 49 and 51 enable predictable detection of any unintentional impedance between a respective direct current line 28, 30 or 43 and the first node 14 due to the fact that they provide paths for direct current of non-infinite impedance from the lines 28 and 30 to the first node 14. The first plurality of impedances 16 cannot provide such direct current paths inasmuch as the capacitance of each impedance thereof appears as an infinite impedance to direct current.

Due to the fact that the typical magnitude of the combined impedances of each of the eight voltage sensing divider strings 45, 47, 49 and 51 is approximately 150,000 ohms, taking into account the switching pattern of thyristor pairs 22 through 24 and 32 through 34, the range of magnitudes of unintentional impedances between each of the lines 28, 30 and 43 and the first node 14 which can predictably be detected is approximately in the range from 0 to 1.5 megohms.

A sensing means generally designated 53 monitors the potential difference between the first node 14 and the second node 20, the magnitude and the frequency of which varies in response to the magnitude and frequency of any current in an unintentional impedance. In particular, the frequency of such potential difference is the same as the frequency of any current in the unintentional impedance. The sensing means 53 includes a frequency selective network 54. The network 54 has the voltage between the first node 14 and the second node 20 as an input voltage thereof. The network 54 produces an output signal substantially proportional to the level of current in any unintentional impedance by providing a frequency selective gain. Accordingly, compensation for frequency-dependent variations of impedance of the first plurality of impedances 16 is provided.

When an unintentional impedance is connected between the first node 14 and any power conductor in the power conversion circuit 10 or its load 40, a current will flow in the unintentional impedance. The magnitude and frequency of this current will be determined by the magnitude and frequency of the voltage at the point where the unintentional impedance is connected (that is, the voltage energizing the unintentional impedance) and by the magnitude of the unintentional impedance.

The voltage appearing between the first node 14 and the second node 20 will be caused by the return of this current through the intentional impedances 16 (in combination with impedances 45, 47, 49 and 51). If the intentional impedance is variable with frequency, the magnitude of the voltage between nodes 14 and 20 will not be a good measure of the current in the unintentional impedance. To recover the information as to the magnitude of the current in the unintentional impedance, the invention could be implemented by establishing the value of the impedances 18 as a model of the intentional impedances 16 (in combination with the impedances 45, 47, 49 and 51) such that the frequency variations of the impedances 18 are intended to be the same as those of the impedances 16 (in combination with impedances 45, 47, 49 and 51). If the sensing means 53 then monitors the current which passes to the first node 14 by the impedances 18, it will measure a signal proportional to the current in the unintentional impedance not distorted by the frequency-dependent variations of impedances 16 (in combination with impedances 45, 47, 49 and 51).

The invention is shown in FIG. 1 as implemented by a similar structure which carries out this same concept. The three impedances 18 are made resistive, and the frequency selective network 54 is caused to model the reciprocal of the frequency-dependent impedance of intentional impedances 16 (in combination with impedances 45, 47, 49 and 51).

Where neither the frequency selective network 54 nor the second plurality of impedances 18 compensates for frequency-dependent variations of the impedances 16, the detection system operates in a less predictable manner than otherwise obtainable.

The frequency selective network 54 also renders the sensitivity of the detection system to unintentional impedances energized by voltages of different frequencies substantially constant. The variation in the sensitivity of the detection system results from the fact that substantially different ranges of magnitude of unintentional impedance can be predictably detected depending upon the frequency of voltage energizing the unintentional impedance. Examples of such different ranges of magnitude of unintentional impedance which can be predictably detected are mentioned above. The frequency selective network 54 renders the sensitivity of the detection system described herein substantially constant by providing the gain transfer function shown in the block for the frequency selective network 54 in FIG. 1. This gain transfer function is also effective for providing the frequency-selective gain which compensates for frequency-dependent variations of impedance of the first plurality of impedances 16. The transfer function, it is to be understood, is specifically chosen for the network described herein and having the specific values of frequency and impedance specified herein. The gain at 60 hertz, pertaining to an unintentional impedance energized by a 60 hertz voltage, is substantially larger than the gain at substantially lower frequencies including direct current, pertaining to unintentional impedances energized by a voltage having a corresponding frequency. Further, the gains at both the ripple voltage frequencies of 180 hertz and 360 hertz, pertaining to unintentional impedances energized by an unbalanced and by a balanced ripple voltage, respectively, are approximately equal to the gain of 60 hertz. The gains at 180 hertz and at 360 hertz, however, are set independently of the gain at 60 hertz, and depend upon the desired sensitivity of the detection system to unintentional impedances energized by a balanced and an unbalanced ripple voltage, respectively. The gain transfer function may be modified in an apparent manner to obtain other desired sensitivity relationships.

The output signal produced by the frequency selective network 54 is applied to an input of a full-wave rectifier 56 through a line 55. The rectifier voltage produced by the full-wave rectifier is applied to an input of a comparator 58 through a line 57. Another input of the comparator 58 is connected to the output of a reference voltage source 60 through a line 59. The amplitude of the reference voltage produced by the source 60 represents an arbitrarily selected value of an unintentional impedance. The amplitude of the reference voltage also could be variable in response either to a manual setting of a control (not shown) at the source 60 or to an automatic control (not shown) at the source 60 which is determined by a function of operating conditions. The comparator 58 compares the rectified voltage at the input connected to the line 57 with the reference voltage at the input connected to the line 59. When the voltage at the input connected to the line 57 exceeds the reference voltage at the input connected to the line 59, a system output signal is produced at a system output 61, indicating that a predetermined value of an unintentional impedance is present. This signal at output 61 may be used for any desired purpose such as sounding an alarm, activating an indicating light, shutting down the system, etc.

Figure 2:
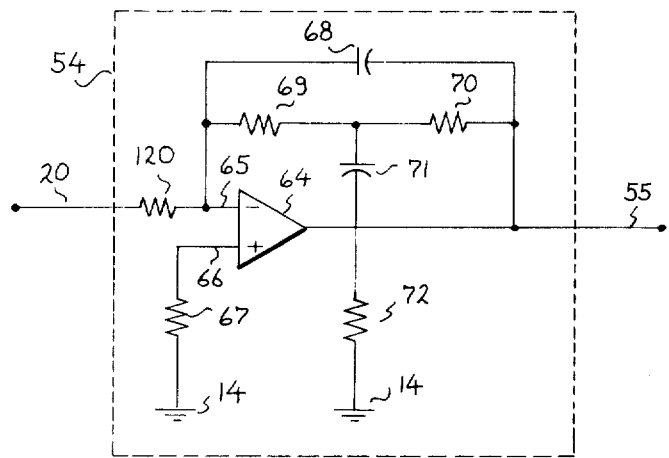
FIG. 2 is a circuit diagram showing one implementation for a frequency selective network block (54) of FIG. 1.

FIG. 2 shows one possible circuit implementing the frequency selective network 54. In this circuit, an operational amplifier 64 has an inverting input connected to the second node 20 through a resistor 120 and a line 65. A noninverting input of the amplifier 64 is connected through a line 66 and serially through a resistor 67 to the first node 14. A feedback network is connected between the output line 55 of the amplifier 64 and its input line 65, which network includes a capacitor 68 connected in parallel with a serially-connected pair of resistors 69 and 70. The node formed by the interconnected terminals of resistors 69 and 70 is connected to the first node 14 through the series circuit including a capacitor 71 and a resistor 72. The curve for the gain transfer function shown in the block for the frequency selective network 54 in FIG. 1 is achieved inasmuch as the impedance characteristics of the feedback network connected between the line 55 and the line 65 vary with frequency. In the curve, the zero-sloped segment commencing with direct current is determined preponderantly by the impedances of the resistors 69 and 70 due to the fact that in the corresponding frequency range the impedances of the capacitors 68 and 71 are very large and, thus, negligible with respect to the impedances of the resistors 69, 70 and 72. The positive-sloped segment of the curve terminating at 60 hertz is determined by the decreasing impedance of the capacitor 71, the impedance of the capacitor 68 still being negligibly large with respect to the impedances of the resistors 69, 70 and 72. The zero-sloped segment of the curve commencing at 60 hertz is determined by the resistors 69, 70 and 72, the impedance of the capacitor 71 being negligibly low with respect to the impedance of resistor 72 and the impedance of the capacitor 68 still being negligibly large with respect to the impedances of the resistors 69, 70 and 72. The negative slope of the curve commencing at 360 hertz is determined by the decreasing impedance of the capacitor 68, which becomes low with respect to the impedances of the resistors 69, 70 and 72, the impedance of the capacitor 71 being negligibly low with respect to the impedance of the resistor 72. Typical values for resistors 67, 69, 70 and 72 for producing the specific curve shown are 47.5 Kohms, 47.5 Kohms, 47.5 Kohms and 2.21 Kohms, respectively. Typical values for capacitors 68 and 72 for producing the specific curve shown are 0.0022 microfarads and 1.0 microfarad, respectively.

Resistor 120 is shown for generality. If this resistor were of zero impedance, the circuit would function by using the combined impedances 18 as the source impedance for amplifier 64. In this case, the amplifier is responsive to the current in impedances 18 rather than voltage difference between nodes 14 and 20. Thus, although the present description speaks in terms of "potential differences", it is to be expressly understood that this language is intended to include as an equivalent the current responsive embodiment just discussed.

In accordance with the operation of the detection system, an unintentional impedance between the power level line 12a and the first node 14 is detected in the following manner. Such an unintentional impedance appears in electrical parallel with the intentional impedance between the power level line 12a and the first node 14, the intentional impedance effectively being the impedance 16a, as described above. The current level in such an unintentional impedance varies according to the magnitude of the unintentional impedance. The currents flowing from each of the power level lines 12a through 12c through the respective ones of the impedances 16a through 16c are accordingly altered. The resulting change in the voltage drops across the respective impedances 16a through 16c causes the potential at the first node 14 to differ from that at the second node 20. When such potential difference exceeds a preselected value which depends upon the amplitude of the reference voltage on the line 59, a system output signal is generated at the system output 61.

Due to the symmetrical disposition of the power level lines 12a through 12c with respect to each other, the detection of an unintentional impedance between either the power level line 12b or 12c and the first node 14 is analogous to the detection of an unintentional impedance between the power level line 12a and the first node 14 as just described.

An unintentional impedance between the positive direct current line 28 and the first node 14 appears in electrical parallel with the intentional impedance between the line 28 and the first node 14, the intentional impedance being the combined impedances of the voltage-sensing divider strings 45, 47, 49 and 51, taking into account the switching pattern of thyristor pairs 22 through 24 and 32 through 34. The currents flowing from the line 28 through the respective impedances of the strings 45, 47, 49 and 51 are accordingly altered. The resulting change in voltage drops across the respective impedances of the strings 45, 47, 49 and 51 causes the potential at the first node 14 to differ from that at the second node 20, and when such potential difference exceeds a preselected value, a system output signal is generated at the system output 61.

An unintentional impedance between the direct current line 43 and the first node 14 is detected in the same manner as an unintentional impedance between the direct current line 28 and the first node 14 inasmuch as the inductor 42 appears as a negligible impedance to the low frequency or direct current voltages which exist at the lines 28 and 43.

Due to the symmetrical relationship of the direct current lines 28 and 30, an unintentional impedance between the line 30 and the first node 14 is detected in a manner analogous to the detection of an unintentional impedance between the line 28 and the first node 14, as described above.

When the frequency and the magnitude of the voltages appearing on the load lines 38a through 38c are close to the frequency and the magnitude of the voltages of the power source 11, an unintentional impedance between one of the lines 38a through 38c and the first node 14 will effectively appear in electrical parallel with one or more of the intentional impedances between the power level lines 12a through 12c and the first node 14, respectively. This is due to the symmetrical nature of the power conversion circuit 10 with respect to both the lines 12a through 12c and to the lines 38a through 38c. The description of the detection of an unintentional impedance between one of the lines 12a through 12c and the first node 14 is thus applicable.

The responsiveness of the detection system to an unintentional impedance between one of the lines 38a through 38c and the first node 14 is relatively less predictable when the voltages on such lines have a frequency and a magnitude which are low in relation to the frequency and the magnitude of the voltages of the power source 11. Under such conditions the ripple voltage produced by the static power converter on the direct current lines 28, 30 and 43 is near its maximum value and is used to detect unintentional impedances between all points on all of the power conductors including and to the right of the direct current lines 28 and 30 in FIG. 1, including the neutral 41 of the load 40. The ripple voltage can be unbalanced by the presence of the inductor 42 between the direct current lines 28 and 43 and have a frequency of 180 hertz for the network described, or it can be balanced and have a frequency of 360 hertz for the network described. An unintentional impedance energized by a ripple voltage appears in parallel with one or more of the intentional impedances between the power level lines 12a through 12c and the first node 14, respectively, the intentional impedances effectively being the impedances 16, as described above. The currents in the intentional impedances are thus altered, resulting in different voltage drops thereacross. The potential at the first node 14 is accordingly altered with respect to the potential at the second node 20, and when such potential difference exceeds a preselected value, a system output signal is generated at the system output 61.

By using an unbalanced ripple voltage, unintentional impedances between points near the neutral 41 of the load 40 and the first node 14 are detectable in the manner just described, regardless of the magnitude and the frequency of the voltages on the load lines 38a through 38c.

Figure 3:
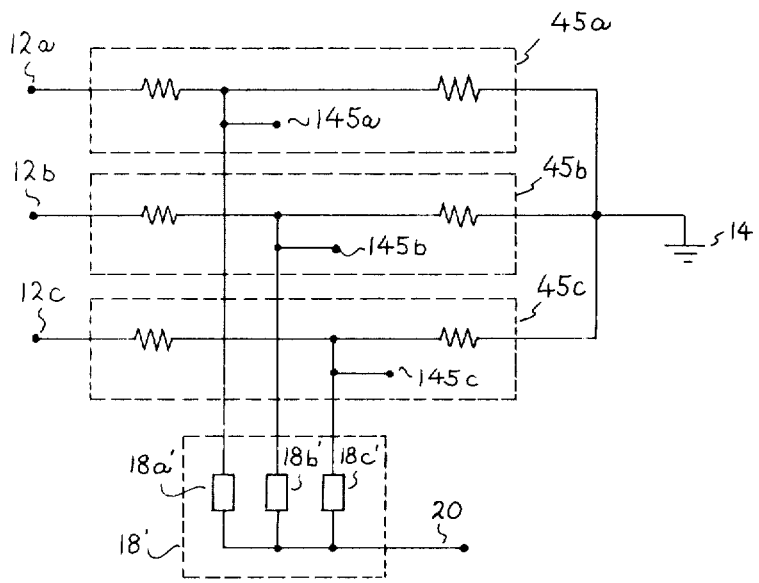
FIG. 3 is a circuit diagram showing an alternative embodiment for a second plurality of impedances (18) of FIG. 1.

FIG. 3 shows one possible embodiment of the second plurality of impedances 18 which is generally designated 18'. The second plurality of impedances 18' does not require the use of power level impedances which should be used where high voltages, such as 460 volts, exist between the power level lines 12a through 12c. As is the case with the impedances 18a through 18c in FIG. 1, the first terminals of impedances 18a' through 18c' are interconnected and define the second node 20. Each of the second terminals of the impedances 18a' through 18c', instead of being connected directly to a different one of the power level lines 12a through 12c, as in FIG. 1, is connected to a respective different node 145a, 145b or 145c of the respective string 45a, 45b or 45c, for sampling signal level voltage, signal level voltage being defined above. Impedances 18a' through 18c' can accordingly constitute signal level impedances, also as defined above. Signal level voltages representative of the voltages on the power level lines 12a through 12c can, however, be generated in other manners which will be apparent to a person skilled in the art.

Figure 4:
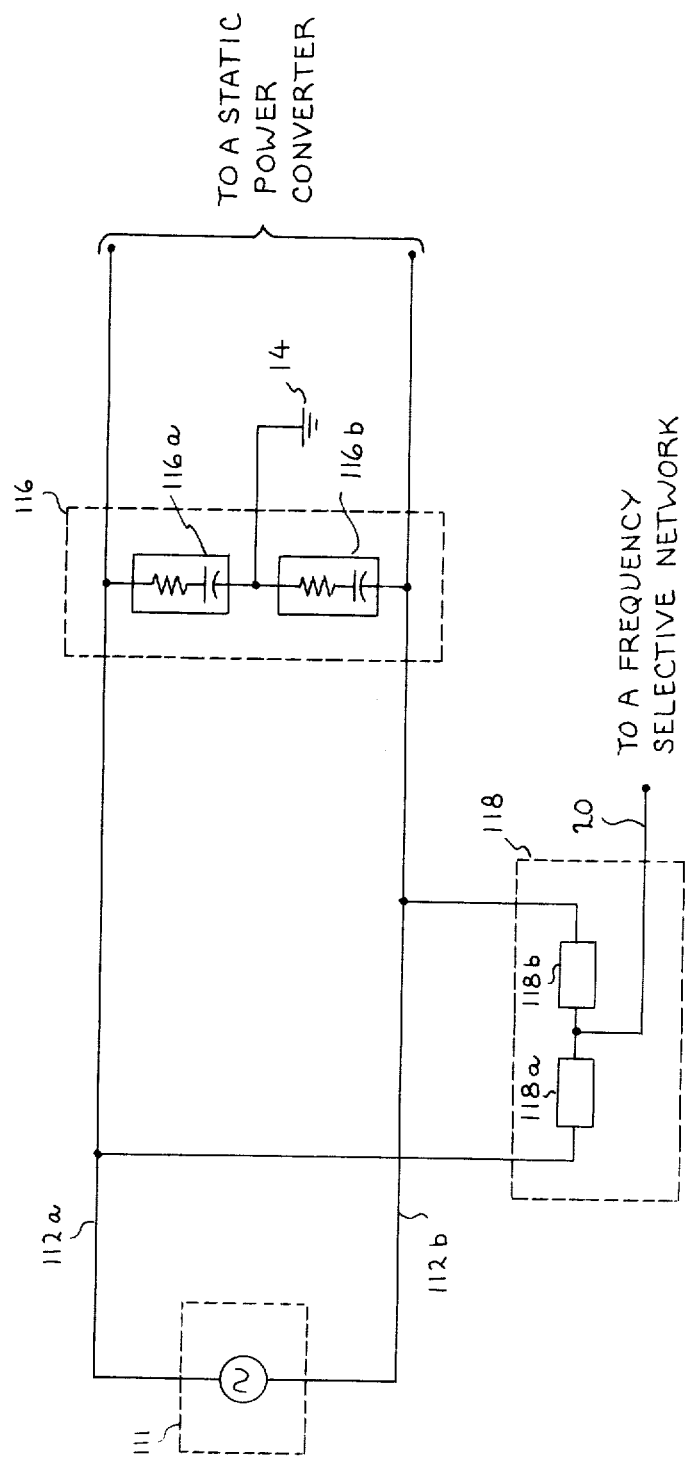
FIG. 4 is a partial circuit diagram showing implementations for a first plurality of impedances (116) and a second plurality of impedances (118) for use with a single-phase power source (111).

FIG. 4 shows a partial circuit illustrating a first and a second plurality of impedances generally designated 116 and 118, respectively, for use in a circuit having a single-phase power source 111. The impedances 116a and 116b have first and second terminals. The first terminals are connected to the first node 14. Each of the second terminals of the impedances 116a and 116b is connected to a respective different one of the power level lines 112a and 112b. The impedances 118a and 118b have first and second terminals. The first terminals are interconnected and define the second node 20. Each of the second terminals are connected to a respective different power level line 112a or 112b. The further details of the description of the single-phase circuit of FIG. 3 are analogous to the details of the above description of the three-phase network of FIG. 1.

It will be understood that the present invention is subject to various modifications, some of which have been suggested above, and all such modifications are considered to fall within the spirit and scope of the invention as defined in the appended claims.

What is claimed is:

1. A system for detecting unintentional impedances between the power conductors and a first node in a network including a power conversion circuit, a plurality of power level lines for connecting said power conversion circuit to an alternating current power source, a static power converter included in said power conversion circuit, and a load supplied by said power conversion circuit, comprising:
  (a) a first plurality of impedances equal in number to said power level lines, each being substantially equal in value and having first and second terminals, all of said first terminals being connected to said first node, and each of said second terminals being connected to a respective different one of said power level lines;
  (b) a second plurality of impedances, distinct from said first plurality, equal in number to said power level lines, each being substantially equal in value and having first and second terminals, said first terminals being interconnected and defining a second node, and each of said second terminals being connected to a respective different point within said network having a potential which is representative of the potential on a respective different one of said power lines; and
  (c) sensing means, responsive to frequencies including that of the source and lower order harmonics thereof, for monitoring the potential difference between said first and second nodes, and effective for providing a system output signal in reaction to said unintentional impedance when said potential difference exceeds a preselected value.

2. The invention defined in claim 1, wherein said sensing means includes means defining a frequency sensitive network.

3. The invention defined in claim 1, wherein said second plurality of impedances is a frequency sensitive network.

4. The invention defined in claim 1, further comprising means to generate on different points within said network, respectively, signal level potentials which are each proportional to the potential on a respective different one of said power level lines, and wherein said terminals of said second plurality of impedances are respectively connected to said different points having signal level potentials thereon.

5. The invention defined in claim 1, 2, 3 or 4, wherein each impedance of said first plurality of impedances comprises a capacitance having a magnitude of impedance at a power frequency which is small relative to the magnitude of impedance at the same frequency of any unintentional capacitance between said first node and the power level line connected to the second terminal thereof.

6. The invention defined in claim 1, 2, 3 or 4, wherein said first plurality of impedances constitutes a line filter network for said power level lines, said filter network comprising:
  (a) a capacitance included in each impedance of said first plurality of impedances and having a magnitude of impedance at a power frequency which is small relative to the magnitude of impedance at the same frequency of any unintentional capacitance between said first node and the power level line connected to the second terminal of the corresponding impedance of said first plurality of impedance; and
  (b) a resistance included in each impedance of said first plurality of impedances, being serially connected to the capacitance included in the same impedance, and having a magnitude of impedance substantially less than the magnitude of impedance of said capacitance as measured at the power frequency.

7. The invention defined in claim 1, 2, 3 or 4, wherein each impedance of said second plurality of impedances has resistance and reactance values substantially proportional, respectively, to the effective resistance and reactance values of the impedance of said first plurality of impedances connected to the power level line to which the second terminal thereof is connected.

8. The invention defined in claim 1, 2, 3 or 4, wherein said sensing means comprises frequency selective means effective for producing an output signal substantially proportional to the level of current in said unintentional impedance.

9. The invention defined in claim 8, wherein said frequency selective means includes means additionally effective for producing a substantially larger output signal, for a constant level of potential difference between said first and second nodes, when said unintentional impedance is energized by a voltage having the frequency of the power source than when said unintentional impedance is energized by a voltage having a substantially lower frequency including direct current.

10. The invention defined in claim 9, wherein said frequency selective means comprises an amplifier having the potential difference between said first and second nodes as an input thereof.

11. The invention defined in claim 10, wherein said amplifier is effective to provide substantially larger gain at the frequency of the power source than at substantially lower frequencies including direct current.

12. The invention defined in claim 1, 2, 3 or 4, further comprising:
  (a) a positive and a negative direct current line in said static power converter;
  (b) means to generate a ripple voltage at a harmonic of said power source between said positive and negative direct current lines; and
  (c) frequency selective means included in said sensing means and effective for producing a substantial output signal having the frequency of said ripple voltage as the fundamental frequency thereof and in response to the potential difference between said first and second nodes when said unintentional impedance is energized by said ripple voltage.

13. The invention defined in claim 12, further comprising:
  (a) an inductor connected serially in either said positive or said negative direct current line of said static power converter and producing an unbalanced ripple voltage on predetermined lines of the power conversion circuit; and
  (b) means included in said frequency selective means and effective for producing a substantial output signal having the frequency of said unbalanced ripple voltage as the fundamental frequency thereof and in response to the potential difference between said first and second nodes when said unintentional impedance is energized by said unbalanced ripple voltage.

14. The invention defined in claim 12, wherein said frequency selective means comprises an amplifier, having the potential difference between said first and second nodes as an input thereof, and effective to provide substantially greater gain at the frequency of said ripple voltage than at substantially lower frequencies including direct current.

15. The invention defined in claim 13, wherein said frequency selective means comprises an amplifier, having the potential difference between said first and second nodes as an input thereof, and effective to provide substantially greater gain at the frequency of said unbalanced ripple voltage than at substantially lower frequencies including direct current.

16. A system for detecting unintentional impedances between the power conductors and a first node in a network including a power conversion circuit, a plurality of power level lines for connecting said power conversion circuit to an alternating current power source, a static power converter included in said power conversion circuit, and a load supplied by said power conversion circuit, comprising:

(a) a first plurality of impedances equal in number to said power level lines, each being substantially equal in value and having first and second terminals, all of said first terminals being connected to said first node, each of said second terminals being connected to a respective different one of said power level lines, and each impedance of said first plurality of impedances comprising a capacitance having a magnitude of impedance at a power frequency which is small relative to the magnitude of impedance at the same frequency of any unintentional capacitance between said first node and the power level line connected to the second terminal thereof;

(b) a second plurality of impedances, distinct from said first plurality, equal in number to said power level lines, each being substantially equal in value and having first and second terminals, said first terminals being interconnected and defining a second node, and each of said second terminals being connected to a respective different point within said network having a potential which is representative of the potential on a respective different one of said power level lines;

(c) frequency selective means, responsive to frequencies including that of the source and lower order harmonics thereof, comprising an amplifier, having the potential difference between said first and second nodes as an input thereof, and effective for providing an output characterized by a gain which is a function of frequency of the potential difference between said first and second nodes and representing the level of current in said unintentional impedance;

(d) a full-wave rectifier having said output of said frequency selective means as an input thereof and effective for providing a rectified output voltage;

(e) means generating a reference voltage representing a preselected value of said unintentional impedance; and (f) means effective for comparing said rectified output voltage with said reference voltage and producing a system output signal when said rectified output voltage exceeds said reference voltage.

17. The invention defined in claim 16, wherein said frequency selective means is effective for providing an output signal substantially proportional to the level of current in said unintentional impedance.

18. The invention defined in claim 17, wherein said frequency selective means includes means additionally effective for producing a substantially larger output signal, for a constant level of potential difference between said first and second nodes, when said unintentional impedance is energized by a voltage having the frequency of the power source than when said unintentional impedance is energized by a voltage having a substantially lower frequency including direct current.

19. The invention defined in claim 16, 17 or 18, wherein said first plurality of impedances constitutes a line filter network for said power level lines, comprising:

(a) a capacitance included in each impedance of said first plurality of impedances and having a magnitude of impedance at a power frequency which is small relative to the magnitude of impedance at the same frequency of any unintentional capacitance between said first node and the power level line connected to the second terminal of the corresponding impedance of said first plurality of impedances; and (b) a resistance included in each impedance of said first plurality of impedances, being serially connected to the capacitance included in the same impedance, and having a magnitude of impedance substantially smaller than the magnitude of impedance of said capacitance as measured at the power frequency.

20. The invention defined in claim 1, 2, 3 or 16, further comprising:

(a) a positive and a negative direct current line in said static power converter;

(b) a non-capacitive impedance connected between said positive direct current line and said first node; and (c) a non-capacitive impedance connected between said negative direct current line and said first node, whereby an unintentional impedance between either said positive or negative direct current line and said first node is detectable.

* * * * *